United States Patent [19]
Auer et al.

[11] Patent Number: 5,714,779
[45] Date of Patent: Feb. 3, 1998

[54] SEMICONDUCTOR MEMORY DEVICE HAVING A TRANSISTOR, A BIT LINE, A WORD LINE AND A STACKED CAPACITOR

[75] Inventors: Stephan Auer, Dachau; Armin Kohlhase, Neubiberg; Hanno Melzner, Unterhaching, all of Germany

[73] Assignee: Siemens Aktiengesellschaft, Munich, Germany

[21] Appl. No.: 730,644

[22] Filed: Oct. 11, 1996

Related U.S. Application Data

[63] Continuation of Ser. No. 367,792, filed as PCT/DE93/00550, Jun. 24, 1993, abandoned.

[30] Foreign Application Priority Data

Jun. 30, 1992 [DE] Germany .................. 42 23 878.1

[51] Int. Cl.[6] .................. H01L 27/108; H01L 27/04; H01L 29/92
[52] U.S. Cl. .................. 257/306; 257/302; 257/308; 257/298
[58] Field of Search .................. 257/298, 306, 257/308, 307

[56] References Cited

U.S. PATENT DOCUMENTS

| | | | |
|---|---|---|---|
| 4,994,893 | 2/1991 | Ozaki et al. | 257/306 |
| 5,061,650 | 10/1991 | Dennison et al. | 437/47 |
| 5,218,219 | 6/1993 | Ajika et al. | 257/306 |
| 5,235,199 | 8/1993 | Hamamoto et al. | 257/308 |
| 5,406,103 | 4/1995 | Ogawa | 257/306 |
| 5,414,655 | 5/1995 | Ozaki et al. | 257/306 |
| 5,436,477 | 7/1995 | Hashizume et al. | 257/306 |

FOREIGN PATENT DOCUMENTS

| | | |
|---|---|---|
| 0430040 | 6/1991 | European Pat. Off. |
| 0457131 | 11/1991 | European Pat. Off. |
| 4221431 | 1/1994 | Germany |
| 4221432 | 1/1994 | Germany |
| 4221433 | 1/1994 | Germany |
| 0237059 | 9/1990 | Japan .................. 257/306 |
| 0125961 | 4/1992 | Japan .................. 252/306 |
| 0307968 | 10/1992 | Japan .................. 257/306 |
| 0251657 | 9/1993 | Japan .................. 257/308 |
| 0275644 | 10/1993 | Japan .................. 257/298 |
| 0112433 | 4/1994 | Japan .................. 257/298 |

OTHER PUBLICATIONS

Patent Abstracts of Japan, vol. 11, No. 288 (E–542) [2735] Sep. 17 1987 & JP-A-62-86853 (FUJITSU).
Patent Abstracts of Japan, vol. 14, No. 293 (E–944) [4735] Jun. 25, 1990 & JP-2-94558 (HITACHI).
Patent Abstracts of Japan, vol. 15, No. 3, Oct. 18, 1990 & JP-A-2-257671 (TOSHIBA).
Patent Abstracts of Japan, vol. 15, No. 408 Oct. 17, 1991 JP-89-0308071 (SONY).
Patent Abstracts of Japan, vol. 16, No. 303, Jul. 3, 1992 & JP-A-90-0196115 (TOSHIBA).
IBM Technical Disclosure Bulletin, vol. 32, No. 98, Feb. 1990, pp. 378–381.
IBM Technical Disclosure Bulletin, vol. 33, No. 2, Jul. 1990, pp. 245–247.
VMIC Conference, Jun. 11–12, 1991, pp. 144–151.

*Primary Examiner*—Wael Fahmy
*Assistant Examiner*—Alexander Oscar Williams
*Attorney, Agent, or Firm*—Herbert L. Lerner; Laurence A. Greenberg

[57] ABSTRACT

A semiconductor memory configuration and a manufacturing process for the semiconductor memory configuration use a polishing process in the manufacture of a semiconductor memory configuration with stacked-capacitor-above-bit-line memory cells. At least TC pillars are created with the aid of a CMP step and a completely planarized surface existing prior to the manufacture of the bit line. Further CMP steps are advantageously used, inter alia, in the manufacture of a TB pillar of a bit line which is countersunk in a trench and of a lower capacitor plate, as well as to completely planarize a cell array and a periphery prior to interconnection of the circuit.

15 Claims, 14 Drawing Sheets

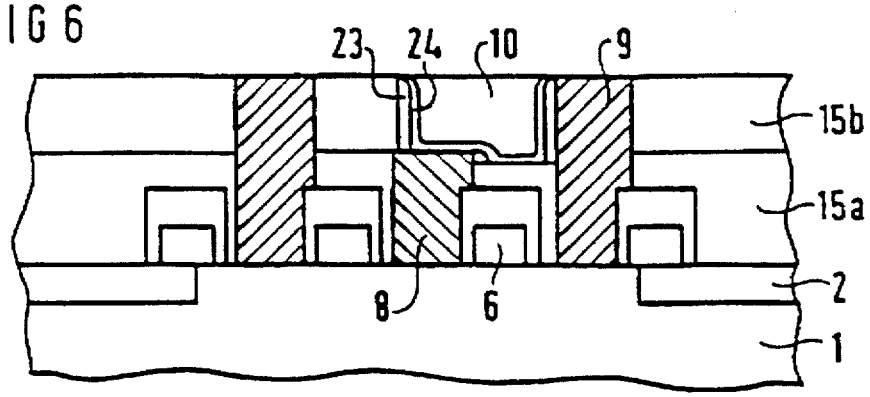
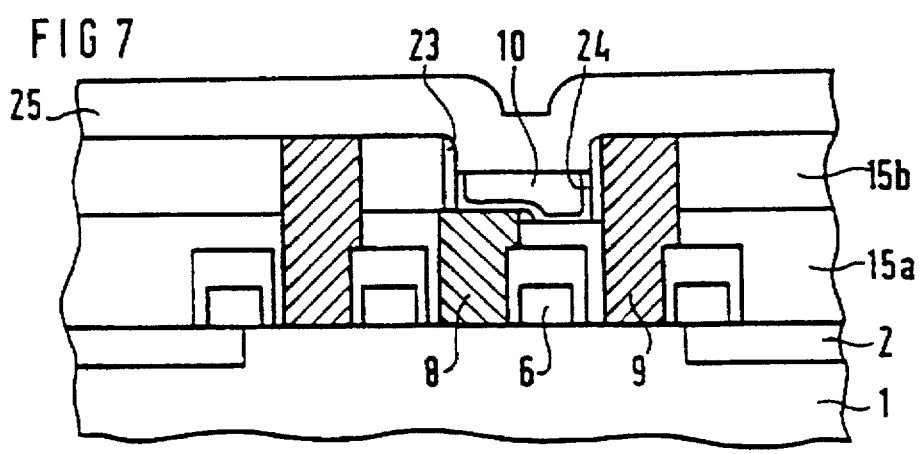
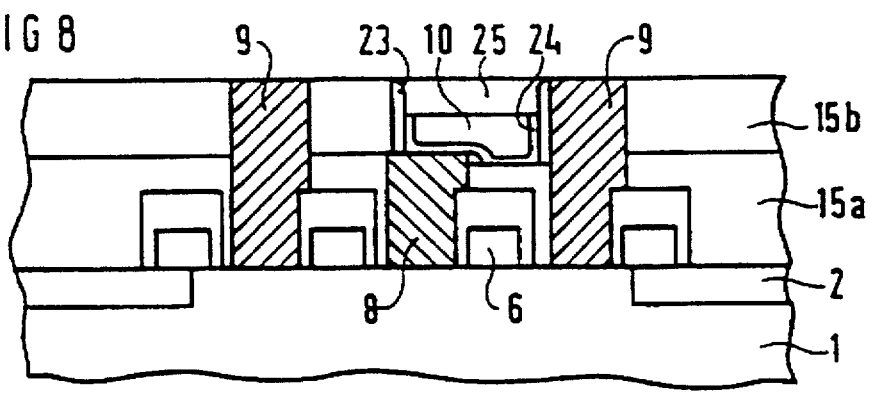

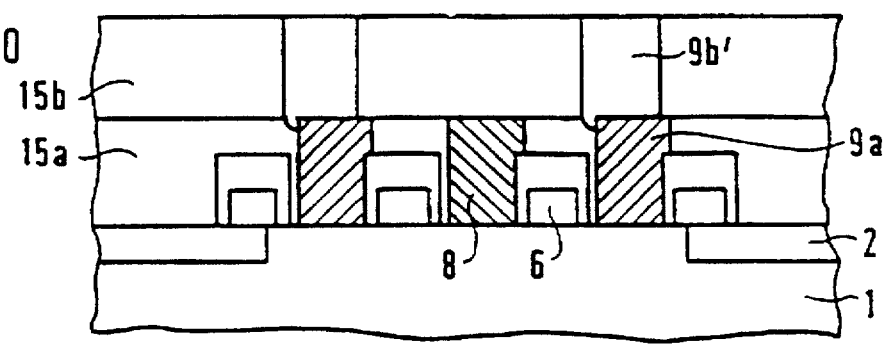
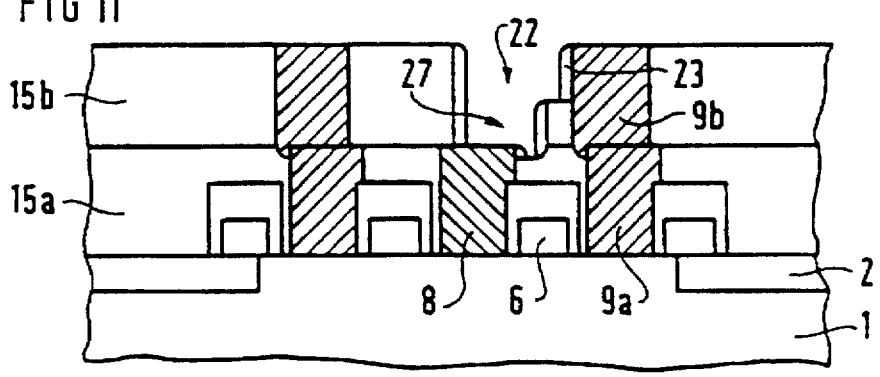
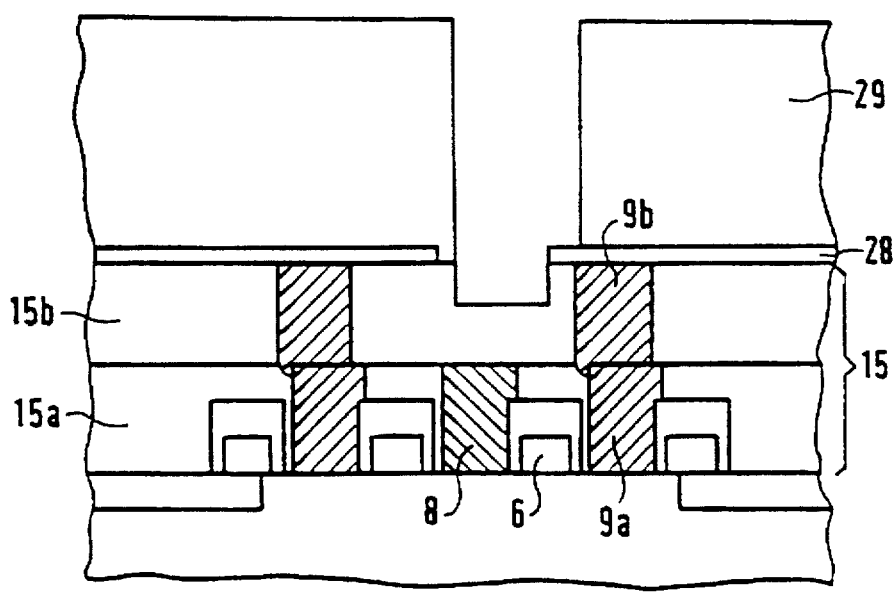

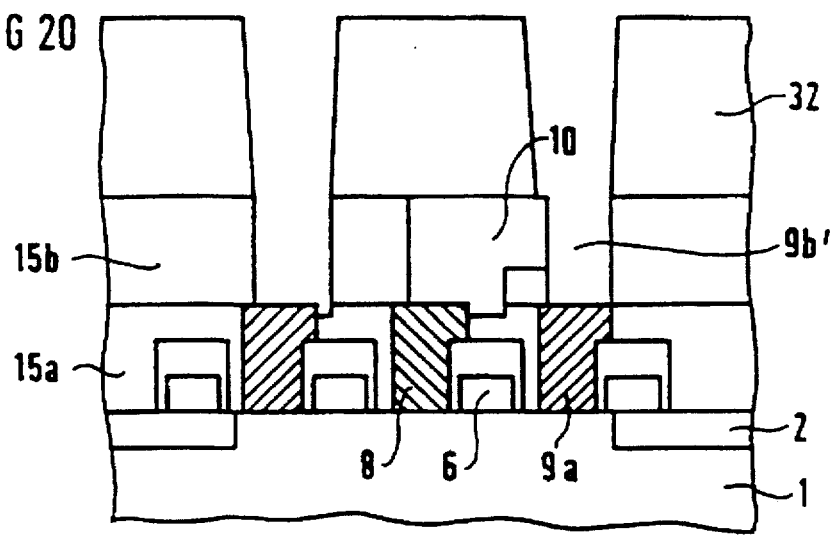
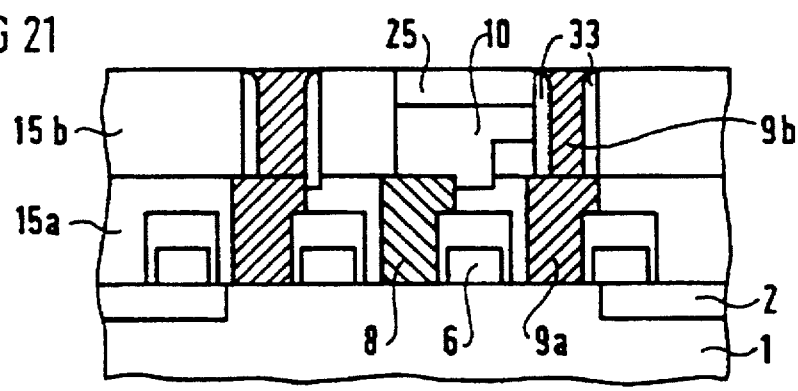
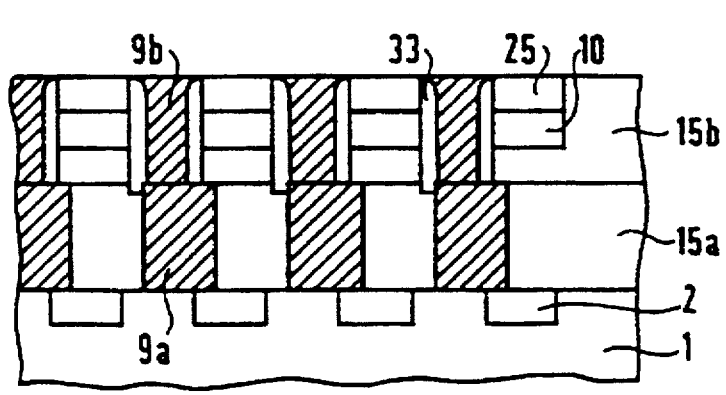

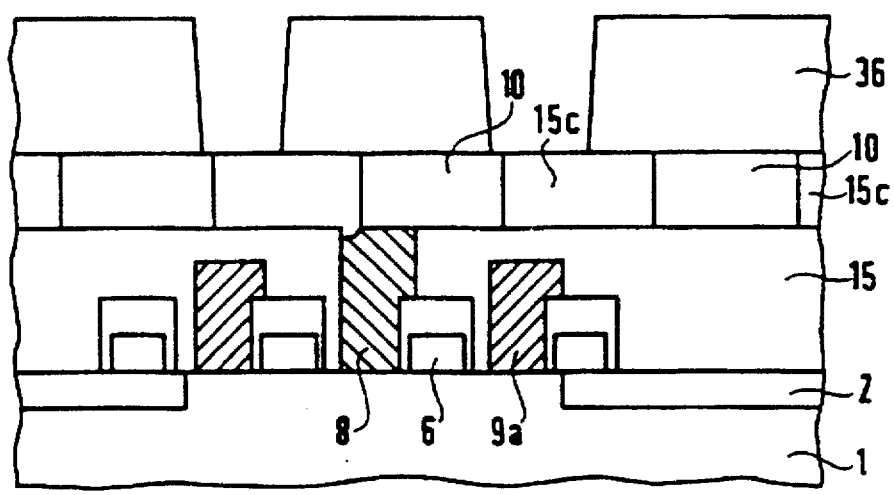
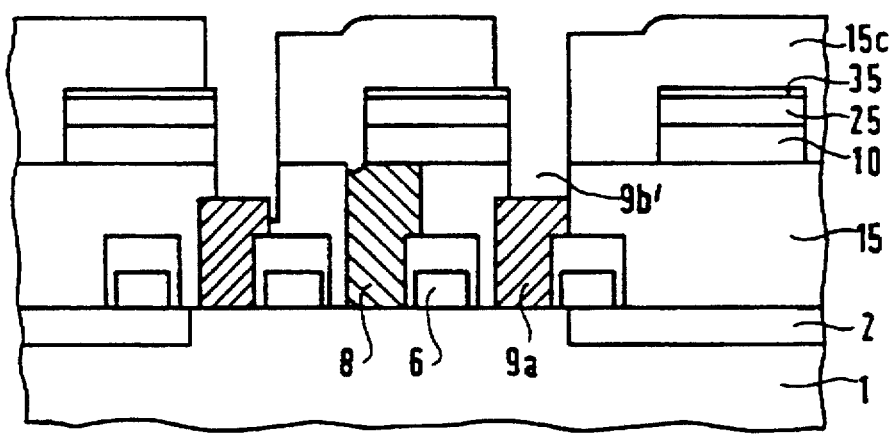
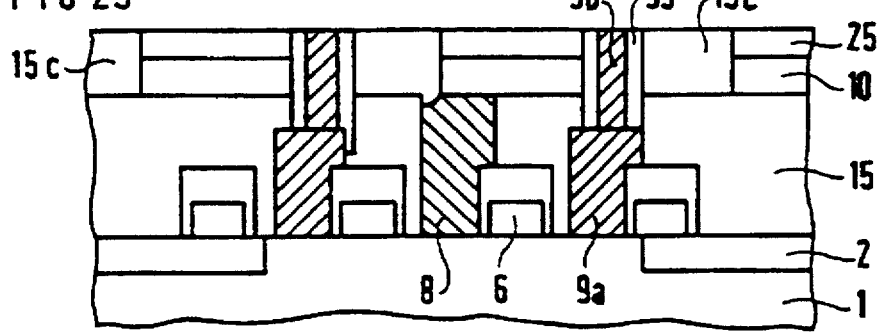

SEMICONDUCTOR MEMORY DEVICE HAVING A TRANSISTOR, A BIT LINE, A WORD LINE AND A STACKED CAPACITOR

CROSS-REFERENCE TO RELATED APPLICATION

This application is a continuation, of application Ser. No. 08/367,792, filed on Dec. 30, 1994 now abandoned, which is a continuation of International Application Ser. No. PCT/DE93/00550, filed Jun. 24, 1993.

BACKGROUND OF THE INVENTION

Field of the Invention

The invention relates to a semiconductor memory configuration including single-transistor memory cells, in which each memory cell has a transistor disposed in a semiconductor substrate, a bit line disposed above the transistor and a capacitor disposed above the bit line, a transistor/capacitor pillar for electrically connecting a first S/D region of the transistor to a lower capacitor plate disposed on a first insulating layer or a planarization layer, a transistor bit-line pillar for electrically connecting a second S/D region to the bit line, and further conductor tracks in the bit-line level being electrically connected to the semiconductor substrate and/or to further underlying conductor tracks through a substrate pillar and/or a word-line pillar.

The invention also relates to a process for manufacturing a semiconductor memory configuration. According to one process, prior to producing the pillars, contact holes are etched in a first insulating layer or a sublayer of the first insulating layer. According to another process, the bit line is manufactured by depositing a bit-line material over the entire surface and structuring it with the aid of a photolithographic procedure and contact holes are etched in a planarization layer or in a sublayer of a first insulating layer, prior to the production of the pillars.

Such devices and methods are known from the IBM Technical Disclosure Bulletin, Vol. 32, No. 9B, February 1990, pp. 378–381.

DRAM semiconductor memories include a number of memory cells in or on a semiconductor substrate which are formed, for example, of silicon. The memory cells are each made up of a capacitor for storing information and a transistor for selecting a particular capacitor. In order to achieve a low access time and required area accompanied by high memory capacity, the integration density of the configuration has to be increased, i.e. the area required by a cell has to be minimized, but at the same time the electrical reliability must still be guaranteed. A layout for such a memory cell is the so-called "Stacked-Capacitor-above-Bitline" cell, in which the capacitor is disposed above the transistor and above the bit line (see, for example, an article by S. Kimura et al., in IEEE Trans. on ED, Vol. 37, No. 3, March 1990, page 737).

On one hand, that cell layout has the fundamental advantage of permitting the available cell area for the capacitor to be optimally utilized. On the other hand, that poses the problem of making the contact from the transistor to the capacitor through the bit-line level. With the conditions of bit-line grid and minimum structural size which are normal for current DRAMs, it is particularly advantageous if the contact is made in a self-aligning manner with respect to the bit line, i.e. the insulation spacing between a contact pillar connecting the transistor to the lower capacitor electrode and the bit line is not defined lithographically but instead results from a suitable processing procedure independently of the lithographically defined spacing.

Insofar as such processes are already known, they have a disadvantage which is that the wafer surface exhibits severe roughness which is due to the specific processing procedure and which makes the subsequent processes more difficult or increases the processing risk. In such a case particular mention may be made of:

- an increase in conductor resistances on top of an uneven base,
- a risk of conductor open circuits,
- a more difficult patterning on top of an uneven base, and therefore a risk of short circuits,
- a severe removal of the underlying material as a result of prolonged overetching,
- a variable contact-hole depth depending on topography, and
- focusing problems during lithography.

While some of those problems can already be alleviated or solved by a local planarization, as is described in German Published, Non-Prosecuted Application DE 42 21 433 A1, a complete planarization is advantageous for solving the focusing problems. In that case, the entire wafer surface lies in a plane which is parallel to the substrate surface and which then corresponds to the focusing plane of the image during lithography.

In the DRAM circuit dealt with in such a case, particularly large problems arise in manufacturing the capacitor on an uneven base. If use is made of a "dish" capacitor, such as is disclosed, for example, in a paper by T. Kaga in IEEE Trans. on ED, Vol. 38, No. 2, Feb. 91, page 255, a sufficiently even base is indispensable. Furthermore, as a result of the great height of the capacitor, particularly large level differences, which make the manufacture of the interconnection levels appreciably more difficult for the reasons mentioned, occur between the cell array and the periphery.

SUMMARY OF THE INVENTION

It is accordingly an object of the invention to provide a semiconductor memory configuration and a manufacturing process for a semiconductor memory configuration, which overcome the hereinafore-mentioned disadvantages of the heretofore-known devices and methods of this general type and which have memory cells of the stack-capacitor-above-bit line type which yields surfaces of improved planarity during manufacture.

With the foregoing and other objects in view there is provided, in accordance with the invention, a semiconductor memory configuration, comprising single-transistor memory cells, each memory cell including a semiconductor substrate; a first insulating or planarization layer disposed above the semiconductor substrate; a transistor being disposed in the semiconductor substrate and having first and second source/drain or S/D regions; a bit line disposed in a bit line level above the transistor; an insulating cover being disposed on the bit line in the other layer and having an upper surface; a capacitor being disposed above the bit line and having a lower capacitor plate disposed on the other layer; a transistor/capacitor or TC pillar electrically connecting the first S/D region to the lower capacitor plate and having an upper surface; a transistor bit-line or TB pillar electrically connecting the second S/D region to the bit line; further conductor tracks in the bit-line level and a substrate or SB pillar electrically connecting the further conductor tracks to the semiconductor substrate and/or further underlying conductor tracks and a word-line or WB pillar electrically connecting the further conductor tracks to the further underlying conductor tracks; the TB, SB and WB pillars having an upper surface being polished and disposed in one completely planarized surface; and the upper surface of the insulating cover and the upper surface of the TC pillar being disposed in another completely planarized surface.

With the objects of the invention in view, there is also provided a process for manufacturing a semiconductor memory configuration including single-transistor memory cells each having a semiconductor substrate; a transistor being disposed in the semiconductor substrate and having first and second source/drain or SD regions; a bit line being disposed above the transistor and having a surface; a capacitor being disposed above the bit line and having a lower capacitor plate; a transistor/capacitor or TC pillar electrically connecting the first S/D region to the lower capacitor plate and having an upper surface; and a transistor/bit-line or TB pillar electrically connecting the second S/D region to the bit line and having an upper surface; which comprises etching contact holes in a first insulating layer or in a sublayer of the insulating layer having an upper surface; then manufacturing the pillars by depositing a pillar material at least in the contact holes and removing the pillar material outside the contact holes with a polishing process; manufacturing the bit line in buried form in the insulating layer, etching a trench in the insulating layer, and depositing and removing a bit-line material outside the trench in a CMP step; covering the surface of the bit line with an insulating cover having an upper surface being disposed approximately at the same height as the upper surface of the insulating layer; and polishing the upper surface of at least one of the pillars in a completely planarized surface.

With the objects of the invention in view, there is additionally provided a process for manufacturing a semiconductor memory configuration including single-transistor memory cells each having a semiconductor substrate; a transistor being disposed in the semiconductor substrate and having first and second source/drain or SD regions; a bit line disposed above the transistor; a capacitor being disposed above the bit line and having a lower capacitor plate; a transistor/capacitor or TC pillar electrically connecting the first S/D region to the lower capacitor plate and having an upper surface; and a transistor/bit-line or TB pillar electrically connecting the second S/D region to the bit line and having an upper surface; which comprises manufacturing the bit line by depositing a bit-line material over the entire surface and structuring it with the aid of a photolithographic procedure; etching contact holes in a planarization layer or a sublayer of an insulating layer, prior to production of the pillars; manufacturing a lower TC pillar being lower than the TB pillar and having a surface being covered with a non-conducting material, prior to deposition of the bit-line material; manufacturing the pillars by depositing a pillar material at least in the contact holes and removing the pillar material outside the contact holes with a polishing process; manufacturing a planarization layer after manufacturing the bit line; etching a contact hole in the planarization layer and the non-conducting material for at least partially laying bare the lower TC pillar, and manufacturing an upper TC pillar by depositing a pillar material at least in the contact hole and removing the pillar material outside the contact hole in a CMP step; and polishing the upper surface of at least one of the pillars in a completely planarized surface.

Further developments, in particular processes for the self-aligned manufacture of the bit line with respect to the transistor/capacitor contact pillar or vice versa, are also the subject of the invention.

The invention is based on the use of a polishing process (so-called chemical mechanical polishing, or CMP) as a complete planarization process. CMP can be used in the case of various materials and is described in greater detail in papers by W. J. Patrick et al., in J. Electrochem. Soc., Vol. 138, No. 6, June 91, page 1778 and by C. Kaanta et al., in VMIC Conference 1991, page 144. The use in the manufacture of a semiconductor memory configuration with a stacked capacitor is unknown.

On one hand, CMP makes it possible to planarize the surface with the following properties:

The planarization is long-range (a few to a few 100 micrometers), the remaining steps are minimal (not more than about 100 nm), and a selectivity between the various materials can be achieved by a suitable composition of the polishing liquid. This makes it possible, for example, to stop at buried layers with a low removal rate.

On the other hand, an efficient use of a CMP step is only possible if the surface is already sufficiently well planarized prior to the process. Otherwise high-level structures would be damaged while unwanted residues remained over deep-lying structures. In practice, therefore, CMP is repeatedly used in the course of the process, the circuit structure is matched to these boundary conditions, and every unavoidable unevenness is smoothed out by additional planarization sequences.

The invention permits a manufacturing process for stack-capacitor-above-bit line memory cells and for a semiconductor memory configuration built up therefrom, which fulfills these boundary conditions that are associated in principle with the use of CMP.

Other features which are considered as characteristic for the invention are set forth in the appended claims.

Although the invention is illustrated and described herein as embodied in a semiconductor memory configuration and a manufacturing process for a semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3 to 32 are fragmentary, cross-sectional views through the semiconductor substrate in a cell array, which are used to clarify process steps of various embodiments and variants of some process steps.

DESCRIPTION OF THE PREFERRED EMBODIMENTS

Figure 1:
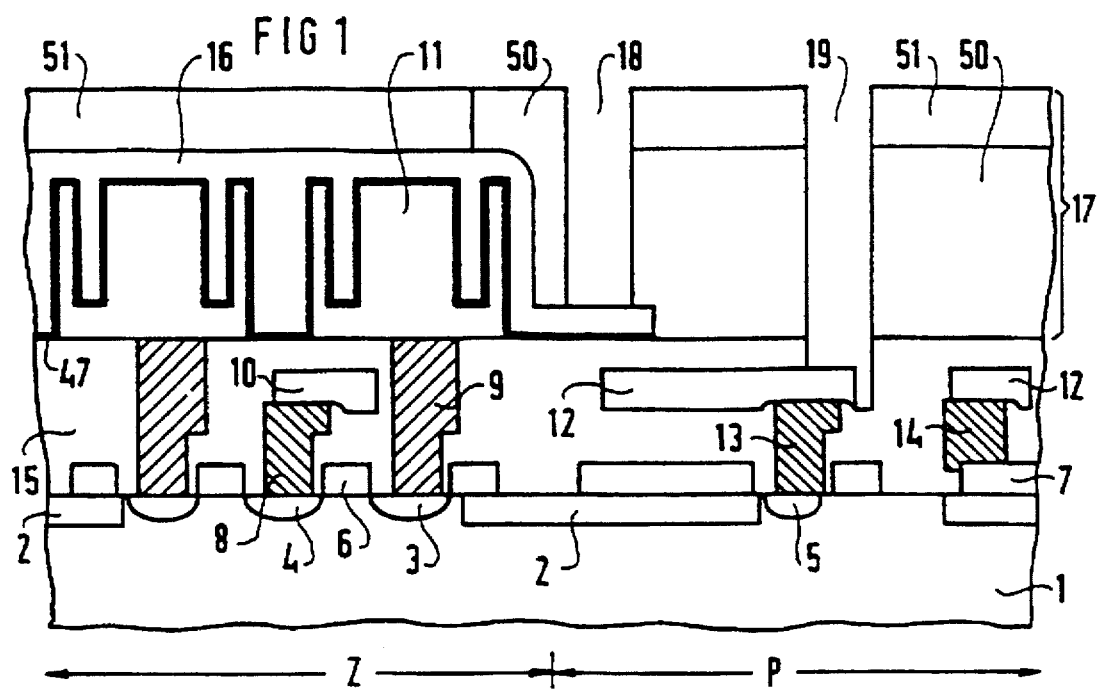
FIG. 1 is a fragmentary, diagrammatic, cross-sectional view through a memory cell and through a portion of the periphery after carrying out the process according to the invention.

Referring now to the figures of the drawing in detail and first, particularly, to FIG. 1 thereof, there is seen a cross section through two adjacent memory cells having a common transistor/bit-line pillar (TB pillar). The cross section is parallel to an active region and passes through a typical peripheral circuit, with the memory configuration having been finished apart from the manufacture of interconnection levels. Disposed in a semiconductor substrate 1 are insulating regions 2 which insulate various memory cells from one another. So-called trench insulation regions having a surface which is situated at the same level as the substrate surface, are preferably used. The semiconductor substrate 1 furthermore contains doped regions 3, 4, 5 acting as a source or a drain (3, 4) of transistors in a transistor array Z or in a periphery P or as a connection (5) to the semiconductor substrate 1. A gate 6 of the transistor and other conducting structures 7 are located on the substrate surface (or on a non-illustrated gate oxide), in a word-line level. A transistor/capacitor pillar 9 (TC pillar) connects the first source or drain region (S/D region) 3 of the transistor to a lower capacitor electrode 11, and a transistor/bit-line pillar 8 (TB pillar) connects the second S/D region 4 to an overlying bit line 10. Provided in the periphery are further pillars, such as an SB pillar 13 which connects conductor tracks 12 situated in the bit-line level to the doped substrate region 5 and a WB pillar 14 which connects the conductor tracks 12 to the conducting structure 7 in the word-line plane.

The pillars 8, 9, 13, 14, the bit line 10 and the conductor tracks 12 are disposed in another layer, such as a first insulating layer 15, which may also be a double layer or a double layer having an overlying planarization layer. The pillars are preferably self-aligned with respect to the gate 6 and/or with respect to the trench insulation 2. It is possible, for example, to manufacture such self-aligned contacts by the process disclosed in a paper by K. Küsters et al., in J. de Physique, C4 No. 9, Sept. 88, page C4 503.

According to the invention, all of the conductor tracks 12 and the bit line 10 situated in the bit-line level are disposed on a completely planar base and, within the scope of the process variations, the tops or upper edges of the TB, SB and WB pillars are at the same height. The first insulating layer 15 or a planarization layer 15c shown in FIGS. 23–25 also have a completely planarized surface, which is at the same height as the top of the TC pillar 9.

The capacitor includes the lower capacitor electrode 11, which is preferably formed as a dish with enclosed lamellae, and a counterplate 16 which is common to all of the memory cells and which is insulated from the lower capacitor electrode by a dielectric 47. A further development of the invention provides for the tops of the lower capacitor plate 11 (i.e. of the dish rim and of the lamellae) to be situated at the same height by the use of a CMP step, so that the tops of the lower capacitor electrodes of all of the memory cells of the semiconductor memory have a complete planarization.

A second insulating layer 17 covers the counterplate 16 in the cell array and the first insulating layer 15 in the periphery. Disposed in the second insulating layer 17 are contact holes 18, 19, referred to as vias, through which the counterplate 16 or the conductor track 12 of the bit-line level (and consequently the semiconductor substrate or the word-line level) can be connected. In a further development of the invention, the second insulating layer 17 has a completely planarized surface. This is particularly advantageous during the etching of the vias 18 or 19. Since the structures (16 or 12) to be laid bare are disposed on completely planarized surfaces or are completely planarized themselves, the layer thicknesses to be etched through in the process are precisely defined. A suitable non-illustrated single-layer or multilayer metallization structure then serves for the low-resistance interconnection of the devices through the vias 18, 19.

Figure 2:
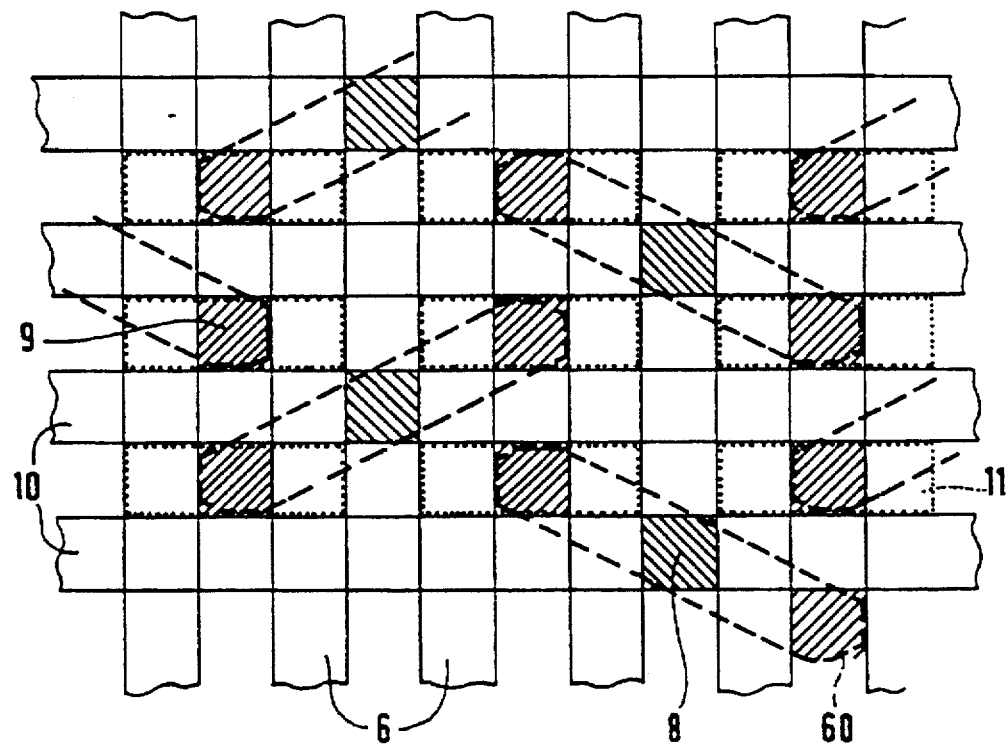
FIG. 2 is a fragmentary, plan view of a semiconductor substrate, showing an embodiment of a layout of memory cells.
Figure 3:
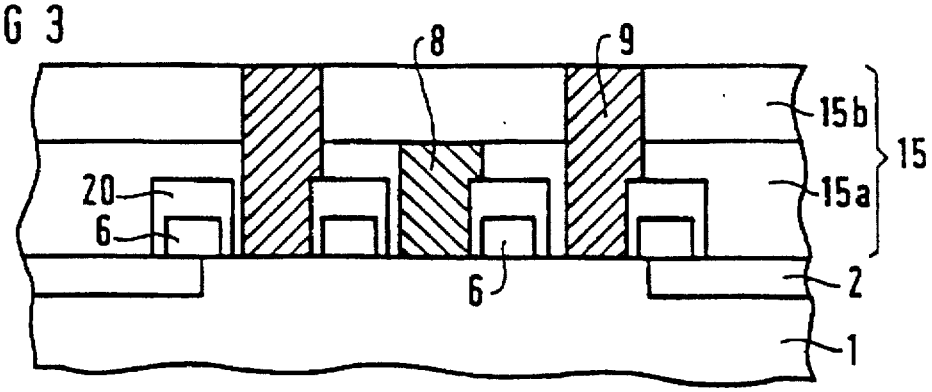
Figure 4:
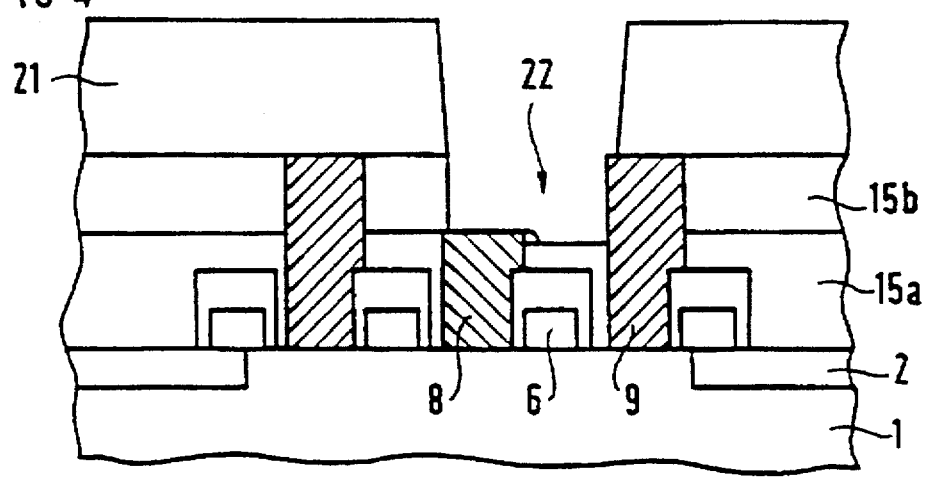

FIG. 2:

FIG. 2 shows a view of a possible layout in the cell array. The bit line 10 cannot (as usual) extend parallel to an active region 60 since a connection from the transistor to the capacitor is otherwise obstructed by the bit line. Instead, the bit line has to enclose an angle with the active region. This can be achieved, inter alia, by inclining the active region (FIG. 2), by swivelling the bit line, or both, or a "bent" active region as in the paper by T. Kaga that was already mentioned can be used. Other solutions are also possible with a so-called "quarter-pitch layout".

A first embodiment of the inventive process in accordance with a basic version is first explained below by reference to FIGS. 3 to 8, and then variants of the basic version are described for various substeps by reference to FIGS. 10 to 25. Some of these variants can be combined with one another. In the first embodiment, CMP steps are used to create the pillars, such steps are used optionally in the bit line level, and subsequent manufacturing steps such as the formation of the capacitor can be carried out in any desired manner. In the figures, the misalignments of the masks of the photolithographic processes that are used with respect to one another, which are generally unavoidable in the process, are indicated in order to clarify the action of the various self-aligning processing procedures. The bit line is cut at an angle so that a bit-line grid appears severely distorted in the cross sections.

In a basic version of an exemplary embodiment 1 (and its variants) the starting point is a semiconductor substrate 1 which already contains, in particular, the trench insulation regions 2 and the transistors (3, 4, 5, 6, 20), with the gate 6 being surrounded on all sides by a suitable gate insulation 20. In order to improve clarity, the gate oxide, as well as the source and the drain are not shown.

FIGS. 3 to 8:

In the basic version of the exemplary embodiment 1, as well as in variants 1 to 9, the bit line 10 is manufactured in a self-aligned manner with respect to the TC pillars 9.

Accordingly, the TC pillars 9, which are about 500 nm higher than the TB pillars 8 (these and subsequent numerical data relate to an exemplary memory cell having the approximate dimensions 0.9 μm×1.8 μm), are created prior to the manufacture of the bit line. For this purpose, a double layer is used as the first insulating layer 15. The TB pillar 8 is first manufactured in a lower sublayer 15a, followed by an upper sublayer 15b and, finally, by the TC pillar 9, in the entire first insulating layer 15. The pillars are generally manufactured as follows (with clarifications in brackets using the example of the TB pillar in accordance with the basic version):

deposition of a dielectric (lower sublayer 15a), optionally, planarization, preferably in a CMP step, etching of contact holes using a photolithographic procedure (TB contact hole in the lower sublayer 15a), deposition of the pillar material (selectively or over the entire surface), preferably after deposition of the contact and/or adhesion layer, removal of the pillar material on the planar surface of the dielectric in a CMP step.

As was already explained, the contact holes for the pillars are preferably manufactured in a self-aligned manner with respect to the gate. Furthermore, it is advantageous to provide, at the same time as the TB pillars 8, all of the envisaged contacts from subsequent metallization levels or from the bit-line level to active regions in the semiconductor substrate as well a to the word-line level having such pillars (13, 14 in FIG. 1) because contact holes of different depth and in some cases of extreme depth would otherwise be necessary later.

In all of the variants, the data relating to the bit line 10 and the TB pillars 8 are therefore also to be extrapolated analogously to the conductor tracks 12 and the SB and WB pillars 13, 14.

After manufacturing the pillars, trenches 22, which serve to receive the bit line (in the cell array) or to receive further conductor tracks (in the periphery) are etched with the aid of a photolithographic procedure (resist mask 21) in the first insulating layer 15, which preferably is formed of undoped or doped silicon oxide or silicon nitride. The trenches 22 are so deep that the buried TB, SB, WB pillars 8, 13, 14 at the base of the trenches are laid bare.

Figure 5:
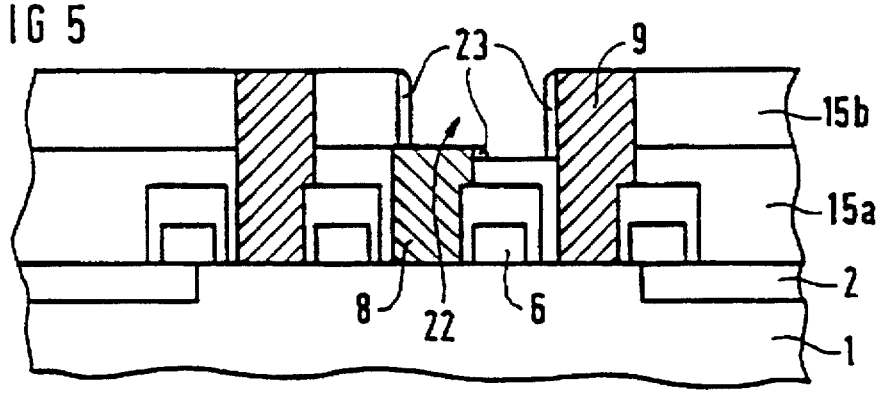

The etching is chosen in such a way that the TC pillars 9 are not etched. That is easy to achieve with standard methods if, for example, the first insulating layer 15 is a silicon oxide and the material of the pillars is silicon or tungsten. It is permissible for the resist mask 21 for manufacturing the trench 22 to lay bare parts of the TC pillar 9 as well. Since, as explained, the etching does not attack the pillar 4). Preferably, an edge insulation 23 is then created at the trench walls, for example by depositing and back-etching a dielectric that is about 75 nm thick. If the deposition is sufficiently conformal and the etching is anisotropic, spacers formed of the edge insulation 23 remain behind at all of the vertical edges (FIG. 5). In particular, on one hand the vertical edge of the TC pillar 9 which is optionally laid bare is laterally insulated by this spacer 23, but on the other hand, the edge insulation 23 can be dispensed with if the TC pillar is not laid bare. A contact and/or adhesion layer 24, for example of Ti/TiN, and then the material of the bit-line 10, for example tungsten, are then preferably deposited. However, a selective deposition may also be chosen. The thickness is preferably chosen in such a way that the etched trenches 22 are filled at least to the top of the surrounding first insulating layer 15. The material of the bit-line 10 and, if applicable, the adhesion/contact layer 24, are then removed in a CMP step on the planar surface, i.e. outside the trenches 22 so that conductor tracks of the bit line 10, which are insulated from one another, are left behind in the trenches (FIG. 6). At the trench base, these conductor tracks make contact with the TB pillars 8 (optionally through the contact and/or adhesion layer 24), and they are insulated from the TC pillar 9 at least by the spacer 23. The bit-line material is then back-etched by about 200 nm, with the etching being selective with respect to the exposed TC pillars 9 and the first insulating layer 15. A photolithographic procedure is not used. The etching may be anisotropic or isotropic, and in particular, a wet etching is also suitable. The bit-line material left behind in the trench then forms the bit line 10 (or, in the periphery, the conductor tracks 12). A dielectric 25 is then deposited, and specifically, in such a thickness that the depressions of about 200 nm which are present are filled at least to the level of the top of the TC pillars (FIG. 7). This dielectric is removed again on the planar surface with the aid of a CMP step (FIG. 8). The surfaces of the TC pillars 9 are then exposed again, while the insulating cover 25 is left behind on top of the bit line 10 (and the conductor tracks 12). A configuration then exists on which the capacitor can be laid down: the bit line 10 and the other conductor tracks 12 situated in the bit-line level are insulated without exception in the upward direction by the cover 25, i.e. the capacitors will only contact the TC pillars 9 that are laid bare, but not the bit line 10 (see FIG. 1), as desired.

Figure 9:
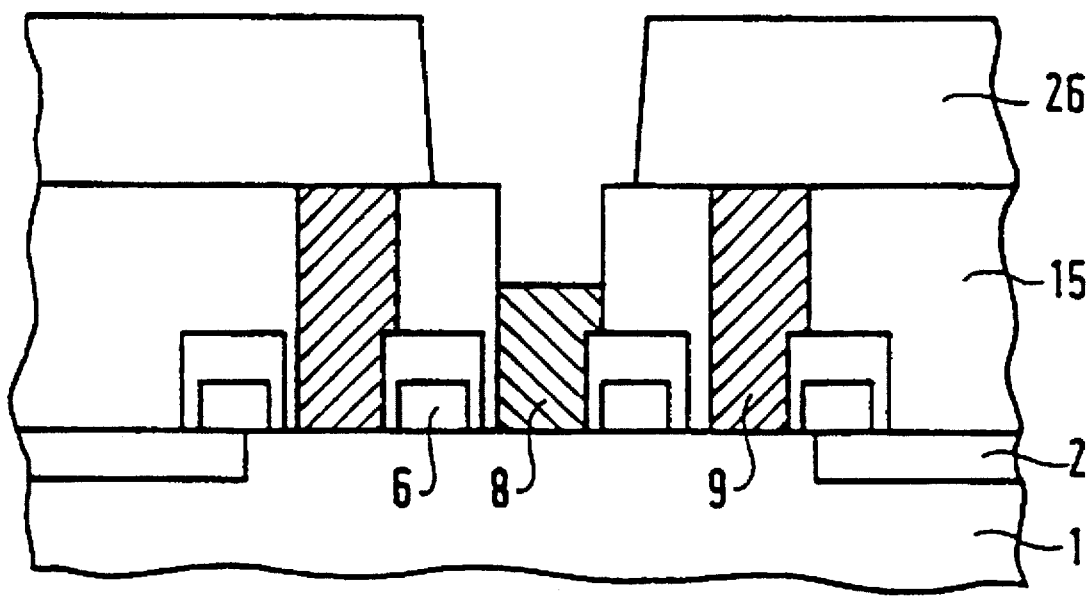

FIG. 9: 1st variant:

If the contact holes are manufactured in a self-aligned manner with respect to the gate 6 or to the trench insulation 2, pillar manufacture in accordance with the 1st or 2nd variant may be preferable. In accordance with the 1st variant, the TB, WB, SB and TC pillars are first all manufactured with the same height, and specifically, as high the TC pillars 9 in the basic version. The first insulating layer 15 is therefore manufactured as a single layer in which all of the contact holes are etched by using a photolithographic procedure. The advantage is that the difficult process of manufacturing holes to be self-aligned with respect to gate and trench insulation is only necessary once. After manufacturing all of the pillars in accordance with the general sequence explained at the beginning, the TC pillars 9 are covered with a resist mask 26 and the other pillars that are laid bare, which will later contact the bit-line level, are etched back by about 500 nm. This etching has to be selective with respect to the first insulating layer 15. Essentially the same situation then exists as in the basic version and the further processing sequence is the same (for example, the manufacture of the trenches 22, optionally spacers 23, filling of the trenches, forming of the covers 25).

FIGS. 10–15, 2nd variant:

After applying the lower sublayer 15a, the TB pillar 8 and a lower TC pillar 9a of the same height are manufactured, and specifically they are as high as the TB pillar in the basic version. The pillar height which appears as a maximum initially is therefore about 500 nm less than in the variants described above, which can markedly reduce the processing variations that occur. The upper sublayer 15b of the first insulating layer is deposited and, with the aid of a photolithographic procedure, a contact hole 9b', which at least partially lays bare the associated lower TC pillar 9a that was already created, is etched for an upper TC pillar 9b (FIG. 12). As explained, the upper TC pillar 9b is manufactured in such a way that an essentially identical situation exists as in the basic version and it is possible to proceed further accordingly.

However, it is advantageous, or necessary in the case of high alignment accuracies, for the trench for the bit line 10 not to be etched through the entire upper sublayer 15b since the risk otherwise exists of the trench base laying bare the horizontal surface of the lower TC pillar 9a. A reliable insulation of this horizontal surface cannot be guaranteed by the edge insulation. The laying bare can be eliminated if the trench 22 for the bit line is only etched to a certain depth in the upper sublayer 15b and the bit line is connected through a bit-line contact hole 27 to the TB pillar (FIG. 11). Then, as already explained, an edge insulation 23 is created in order to insulate the upper TC pillar 9b from the bit line 10 and the bit-line contact hole 27 is jointly filled with bit-line material along with the trench 22.

The bit-line contact hole 27 and the trench 22 may, for example, be manufactured by the process disclosed in a paper by C. W. Kaanta et al., in VMIC Conference 1991, page 144. The additional mask used to produce the bit-line contact hole 27 (BLC mask) has a minimum structural size which is approximately twice as large as, for example, that of the contact-hole mask for etching the lower sublayer 15a. The BLC mask may completely overlap the bit line and the underlying TB pillar (or the conductor track 12 and the underlying pillar 13, 14 in the periphery), but it must not touch an adjacent TC pillar.

Figure 13:
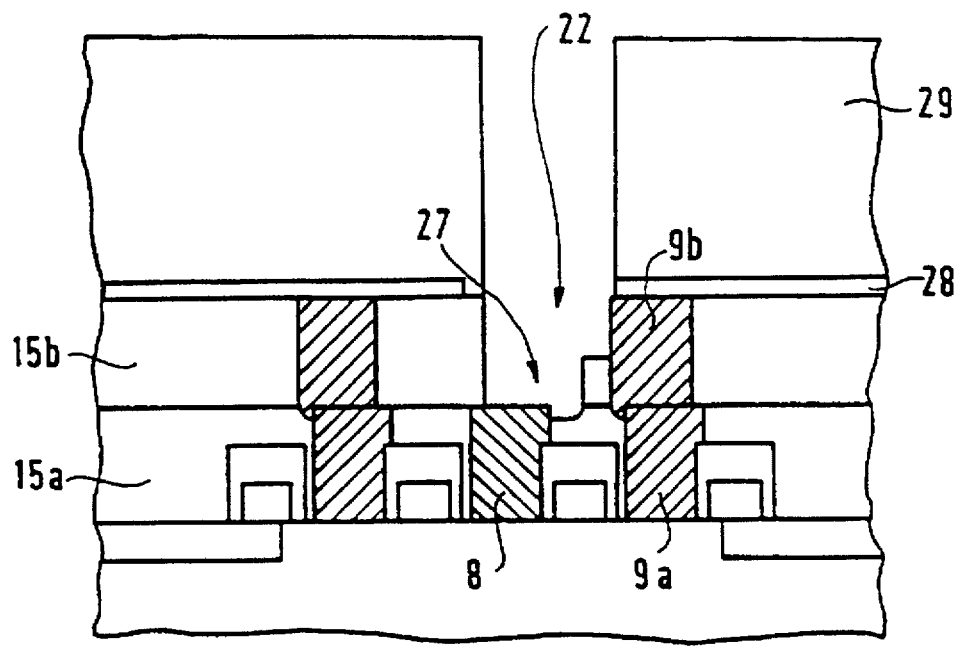
Figure 14:
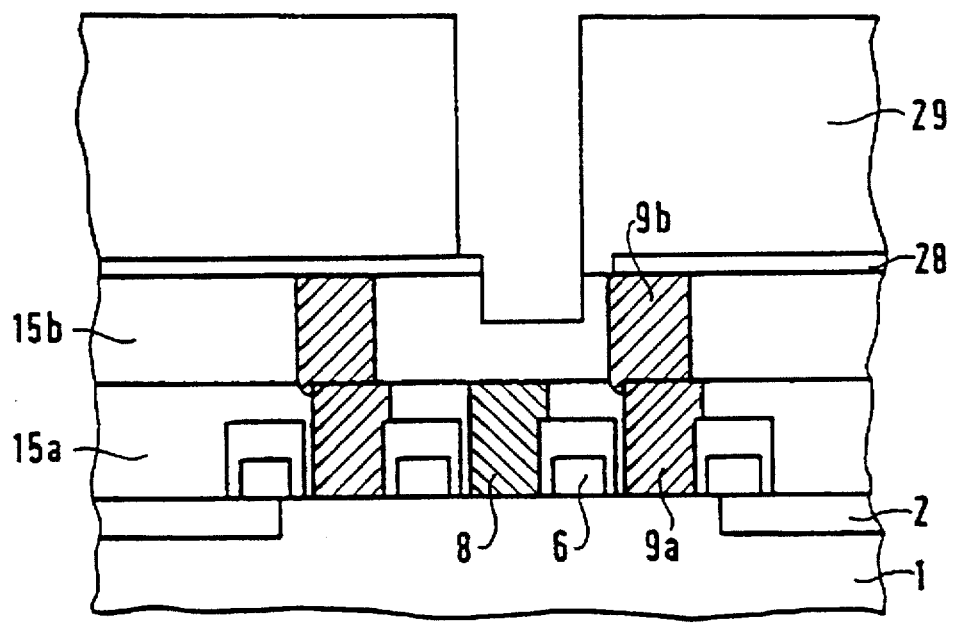
Figure 15:
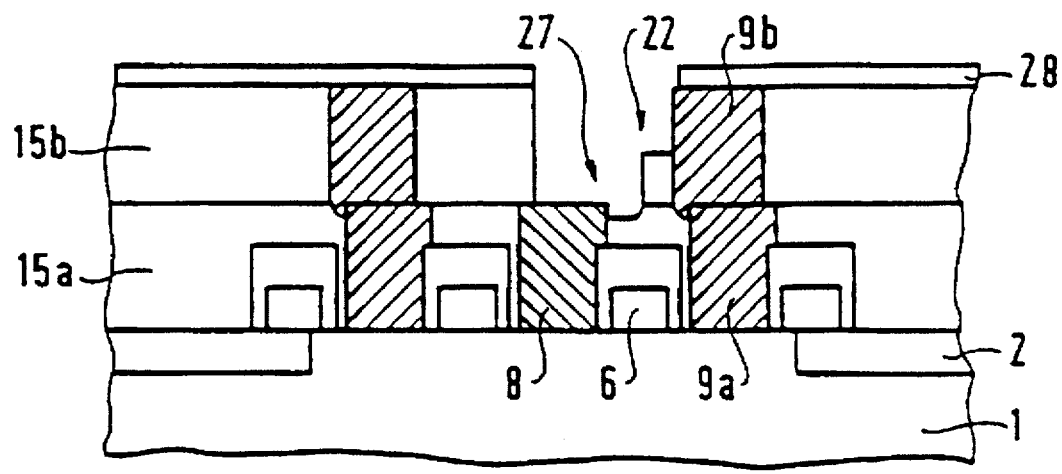

Instead of the "double photolithographic procedure" in accordance with the above-mentioned literature reference which is subject to process uncertainties, the following procedure may be adopted: A first mask layer which, for example, is composed of titanium nitride or polysilicon, is deposited on the surface of the first insulating layer 15 and the TC pillars 9. Then the first mask layer is patterned using the BLC mask to produce a first mask 28. A second mask 29, which generally is formed of resist and is patterned in accordance with the bit-line level, is manufactured on top thereof. The upper sublayer 15b is then etched to a certain depth selectively with respect to the first and the second masks (FIG. 12). The first mask 28 is then removed at those points which are not covered by the second mask 29 and the first insulation layer 15 is etched until the bit-line contact hole 27 lays bare the surface of the TB pillar 8 (FIG. 13). Alternatively, the first mask layer is patterned in accordance with the bit-line level. The second mask 29 which is patterned with the BLC mask is manufactured and the upper sublayer 15b is again etched selectively with respect to the first and the second masks to a certain depth (FIG. 14). The second mask is removed and the first insulation layer is etched further selectively with respect to the first mask until the bit-line contact hole 27 lays bare the surface of the TB pillar 8 (FIG. 15).

The use of the BLC mask also opens up the possibility of manufacturing conductor tracks 12 in two different thicknesses in the bit-line level outside the cell array where no TC pillars occur, depending on whether the BLC mask is open or closed. Conductor tracks which are to have low resistances are manufactured with a large layer thickness by means of an open BLC mask (28 or 29) and those which are to have a low capacitance with respect to underlying and adjacent conductor tracks are manufactured with a low layer thickness by means of a closed BLC mask (28 or 29). It has to be ensured that the BLC mask is always open above the SB and WB pillars 13, 14.

Additionally, the first insulating layer 15 (or its upper sublayer 15b) may be chosen in such a way that the CMP step for producing the cover on the bit line can be carried out selectively with respect to the first insulating layer. For example, it is possible to polish oxide selectively with respect to nitride so that the first insulating layer is preferably formed of an oxide and a nitride layer. The cover is again formed from oxide. The advantage is that the thickness of the cover is uniform and well defined and, in particular, the cover is prevented from being completely perforated in the CMP step.

Figure 16:
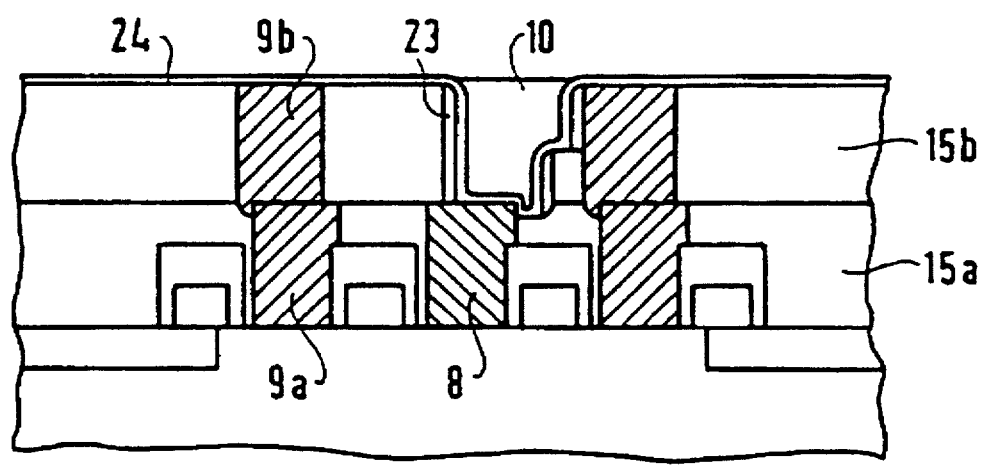

FIG. 16, 3rd variant:

If a back-etching of the bit-line material below the trench edge, in which the back-etching is selective with respect to the TC pillar 9, is not possible or is difficult (for instance, because both are formed of the same material), the CMP step for creating the bit line can be stopped at the underlying, conducting adhesion/contact layer 24. If, for example, the bit-line material is tungsten, titanium nitride is a frequently used adhesion layer 24, at which it is possible to stop with sufficient selectivity during polishing. The TC pillar 9 is therefore then covered with TiN, while the tungsten of the bit line 10 in the trench is laid bare (FIG. 16). Tungsten can then be etched selectively with respect to TiN below the top of the trench. Such etching processes are known and are often used to create tungsten fillings in contact holes. TiN is removed by a further etching. This etching removes only the thin TiN layer and can therefore be kept short. Even if it were not to be selective with respect to the TC pillar, the TC pillar 9 is thus removed to an insignificant extent and in any case projects above the top of the finished bit line 10. The bit line can then be provided with an insulating cover, as described above.

4th variant:

The bit-line material is applied by means of a sputtering or vapor-deposition process so that it is deposited almost exclusively on horizontal but scarcely on vertical regions. This is achieved, for example, by vapor-depositing the material from a virtually punctiform source on the existing surface, which is mounted at a far distance vertically above the substrate. The thin layer of the bit-line material on the trench walls may also be removed completely, if necessary, by a short isotropic etching. The layer thickness deposited on horizontal surfaces is chosen in such a way that the trench 22 is not filled with the bit-line material right up to the top of the trench. A dielectric is then deposited and it is removed, along with the bit-line material, on the planar surface in a CMP step. The bit line 10 along with the insulating cover 25 is left behind in the trench 22.

Figure 17:
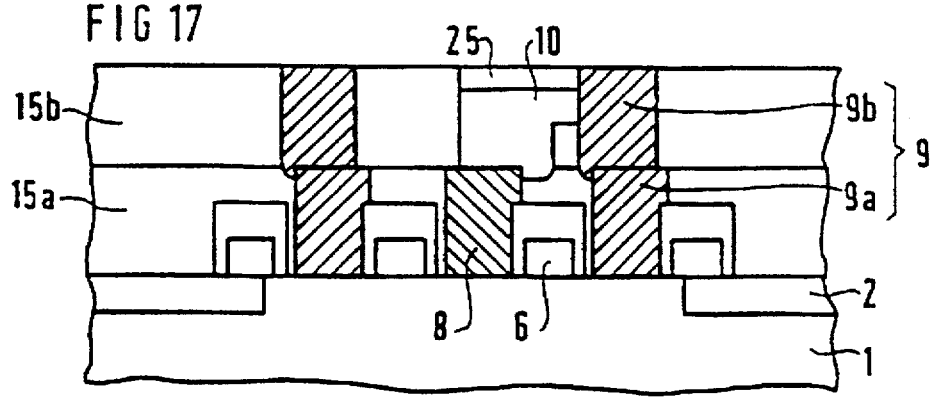
Figure 18:
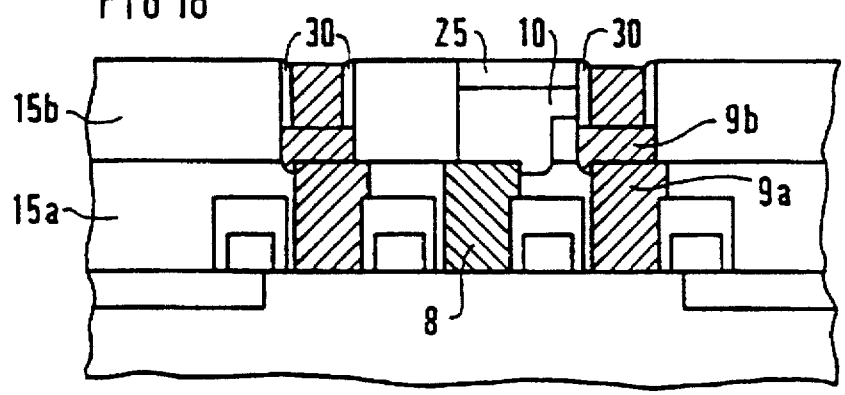

FIGS. 17–18, 5th variant:

First, it is noted that the spacer 23 for insulating the bit line from the TC pillar 9 is omitted. This spacer reduces the track width of the bit line 10, so that a process without a spacer may have advantages. After the insulating cover 25 has been manufactured on the bit line 10, the surface of the TC pillars 9 is exposed, while the bit line is protected everywhere by the cover 25 (FIG. 17). It is then therefore possible to back-etch selectively with respect to the first insulating layer and to the cover 25 of the TC pillars 9 without a further mask, and specifically more deeply than the bottom of the bit line 10. An edge insulation, for example a spacer 30, is then manufactured on the walls of the hole that is produced and the hole is filled with a suitable conducting material, for example doped polysilicon (FIG. 18). The spacer 30 then in turn insulates the TC pillar from the bit line 10.

In accordance with a similar variant, the spacer 23 in the trench 22 is not entirely omitted but instead is only made narrower. The spacer 30 is made relatively narrow as just described. The two spacers 23 and 30 are situated next to one another and the thickness of the insulation between the bit line 10 and the TC pillar 9 is the sum of the two spacer widths. Depending on the given boundary conditions, the necessary thickness can therefore be freely divided into the two spacer widths. A further advantage of the procedure of not entirely omitting the spacer 23 in the bit-line trench appears in the back-etching of the TC pillar. If there is no spacer in the bit-line trench 22, on one hand the back-etching must obviously be anisotropic in order not to damage the bit-line material, and on the other hand no residues of the pillar material must be left behind along the edge of the hole. If the bit line 10 is protected by a thin spacer 23, an isotropic back-etching of the TC pillar 9 can also be used, such as the same etching process as in the first back-etching of the TC pillar.

6th variant:

If the bit line 10 is formed of a material which has a non-conducting, resistant oxide (for example doped polysilicon), the cover 25 may also be manufactured by an oxidation. The requirement is that the TC pillar be formed of a material which, during this oxidation, does not oxidize or oxidizes sufficiently more slowly than the bit-line material. A thin oxide being optionally formed on the TC pillar may be removed by means of an etching or in a CMP step without perforating the thicker cover on top of the bit line. Instead of an oxidation, it is also possible in this case (and in the following variants) to use another suitable chemical reaction which creates a resistant material from a conducting material, for example a nitriding.

Figure 19:
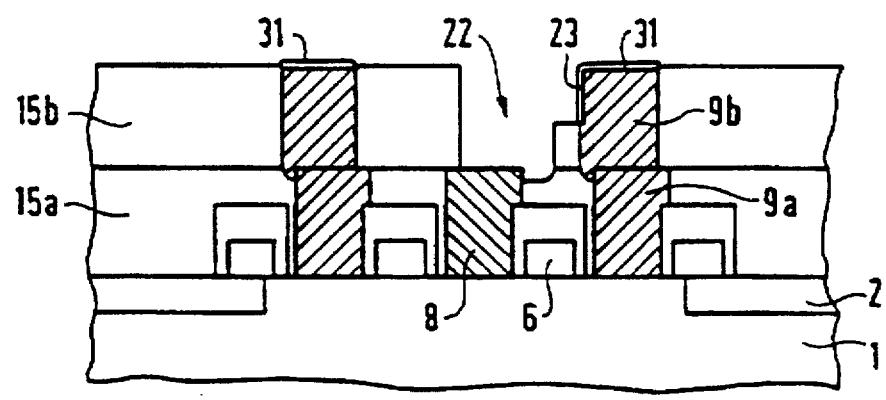
Figure 26:
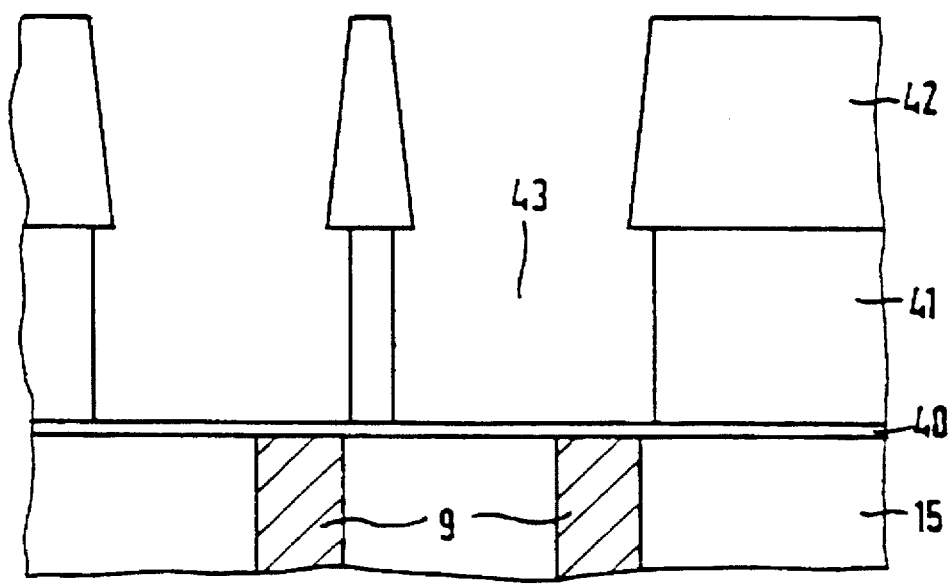
Figure 27:
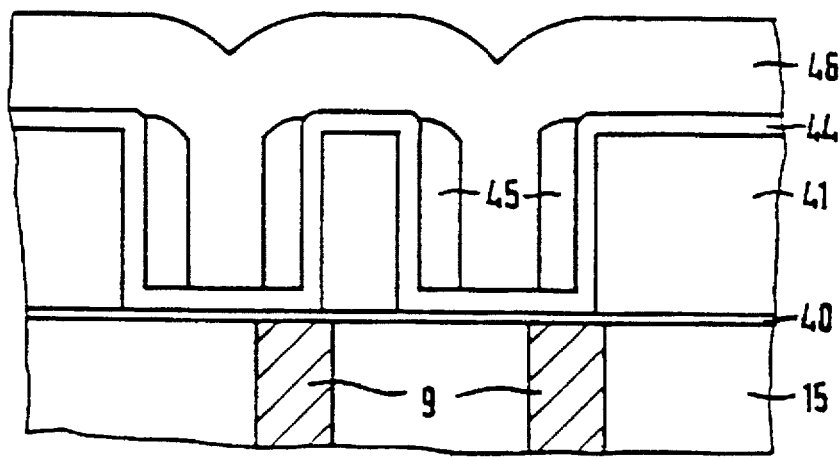
Figure 28:
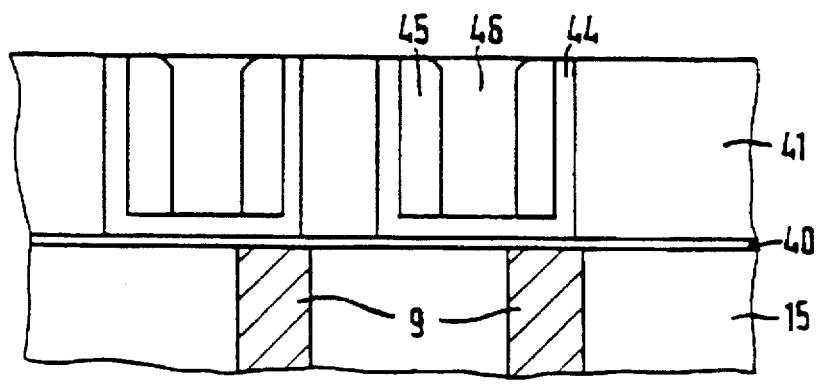

FIG. 19, 7th variant:

If the TC pillar is formed of a material which has a non-conducting resistant oxide (for example doped polysilicon), the edge insulation 23 for the insulation between the bit line 10 and the TC pillar 9 can also be manufactured by an oxidation after etching the bit-line trenches 22. The edge insulation 23 then is formed of the oxide of the pillar material. An oxide 31 formed on the horizontal surface of the TC pillar 9 is removed again no later than in the CMP step for creating the cover in order to open the TC pillar in the upward direction. An advantage in the case of this variant is that the trench 22 is not itself made narrower by the spacer. If the TB pillar is laid bare at the trench base after etching the trench, a requirement is that the material of the TB pillar 8 does not oxidize, or oxidizes sufficiently more slowly than the TC pillar 9 during this oxidation (for example, the TB pillar is formed of a polysilicon which is more lightly doped than the TC pillar). A procedure similar to the second variant is also possible. In this case, the trench 22 is not etched down to the TB pillar 8 but it is only opened after the oxidation of the TC pillar by using a separate mask. The TB pillar 8 is therefore not exposed during the oxidation, so that no oxide is formed, or an oxide is formed which is substantially thinner than on the TC pillar 9.

8th variant:

The oxide layer 31 on the TC pillar 9 in accordance with the 7th variant can also be used during the back-etching of the bit line below the trench top. In this case, the CMP step for creating the bit line is carried out selectively with respect to the oxide cover 31 of the TC pillar. During the back-etching of the bit line, the TC pillar is then protected by the oxide cover 31.

9th variant:

The oxide cover 31 on the TC pillar 9 can also be manufactured after the CMP step for creating the bit line, provided the bit-line material does not oxidize, or only oxidizes slowly (for example lightly doped polysilicon) during the oxidation. As in the 8th variant, the oxide cover 31 then protects the TC pillar during the back-etching of the bit line below the trench top.

FIGS. 20-22, 10th variant:

In contrast to the variants described above, in the 10th and 11th variants it is not the bit line which is manufactured in a self-aligned manner with respect to the TC pillars but the upper TC pillar 9b with respect to the bit line 10. As in the case of the 2nd variant, the TB pillar 8 and the lower TC pillar 9a are first manufactured in the lower sublayer 15a of the first insulating layer 15. The upper sublayer 15b is applied but initially no upper TC pillar 9b is manufactured. The bit-line contact hole 27 and the bit-line trench 22 are filled (with the material of the bit line 10), in which process no cover is initially laid down. With the aid of a photolithographic procedure (resist mask 32) contact holes 9b' are etched which sufficiently lay bare the surface of the lower TC pillars 9a. The etching of the first insulating layer 15 takes place in this process selectively with respect to the bit-line material (FIG. 20). An edge insulation, for example an oxide spacer, is introduced into the hole, i.e. also at the optionally laid-bare edge of the material of the bit-line 10. The hole left behind is filled with the upper TC pillar 9b, and then the cover 25 on the bit line 10 is manufactured by one of the processes already explained above (FIG. 21).

On one hand, an advantage of this variant is that the bit line is not made narrower by spacers. On the other hand, the diameter of the upper TC pillar 9b is reduced by a spacer 33. However, it is possible to make the opening in the resist mask 32 (for creating the upper TC pillar) as wide as desired over the bit line 10. That is to say the entire space available between two bit lines (less the spacer 33) is available for the contact. FIG. 22 shows a cross section through the semiconductor substrate in the word line direction at the level of the TC pillars (seen in FIG. 2), from which it becomes clear that the available space is optimally utilized.

11th variant:

The lower TC pillars 9a are manufactured in such a way that they are lower than the TB, SB and WB pillars 8, 13, 14, for which purpose a process analogous to the basic version or to the first variant can be used. The etching of the bit-line trench 22 opens the TB pillar 8 (and the pillars in the periphery), but not the more deeply situated lower TC pillars 9a. The further procedure can take place as in the 10th variant.

FIG. 23, 12th variant:

The bit line 10 and the further conductor tracks 12 in the bit-line level can also be manufactured with the aid of a conventional patterning. Contact pillars are manufactured by one of the process variants disclosed above, and specifically in such a way that the TB, SB and WB pillars 8, 13, 14 are exposed, while the lower TC pillars 9 are covered by the first insulating layer 15. The bit-line material is then deposited over the entire surface and patterned with the aid of a photolithographic procedure. A non-conducting planarization layer 15c for filling the gaps between the conductor tracks 10, 11 which are created in this way is deposited and, if necessary, planarized, for example in a CMP step (FIG. 23). Preferably, the CMP step is carried out in such a way that the surface of the bit-line material 10 is not covered by the planarization layer 15c. The contact holes for the upper TC pillar are then etched with the aid of a photolithographic procedure (resist mask 36), with the etching being carried out selectively with respect to the bit-line material. The contact hole opens bare the surface of the buried lower TC pillars 9a. As already explained, a spacer is introduced into the hole, and then the upper TC pillar 9b is laid down. After back-etching the bit-line material to the bit line 10, the latter is provided with the cover 25. In this variant, in order to maintain the complete planarity of the memory configuration, it can be necessary to provide dummy structures in the bit-line level at the points at which unduly wide spacings exist between the conductor tracks 12. Alternatively, these regions can also be filled with a dielectric.

FIGS. 24-25, 13th variant:

The procedure is as in the preceding variant 12, however not only is the bit-line material deposited and patterned, but a three-fold layer including bit-line material, cover material 25 and an etch-stop layer 35. The etch-stop layer 35 can be thin and is formed, for example, of polysilicon, titanium nitride or tungsten. After deposition of the planarization layer 15c to fill the gaps, the contact hole 9b' is etched for the upper TC pillar 9b, with the etching being carried out selectively with respect to the etch-stop layer (FIG. 24). The spacer 33 is again created in the hole 9b'. After deposition of the pillar material for filling the hole, the pillar material, the planarization layer 15c and the etch-stop layer 35 are removed in a multiple CMP step (FIG. 25). The individual CMP steps are advantageously matched to the materials in such a way that stopping either takes place at the etch-stop layer 35 and the latter is then removed by a short and consequently precise CMP step or stopping takes place at the cover 25.

The advantage of this variant is that the thicknesses of the bit line 10 and of the cover 25 are defined not by a back-etching, but essentially by layer depositions (and, consequently, generally more uniformly and more precisely).

FIGS. 26–29: 2nd embodiment

Figure 29:
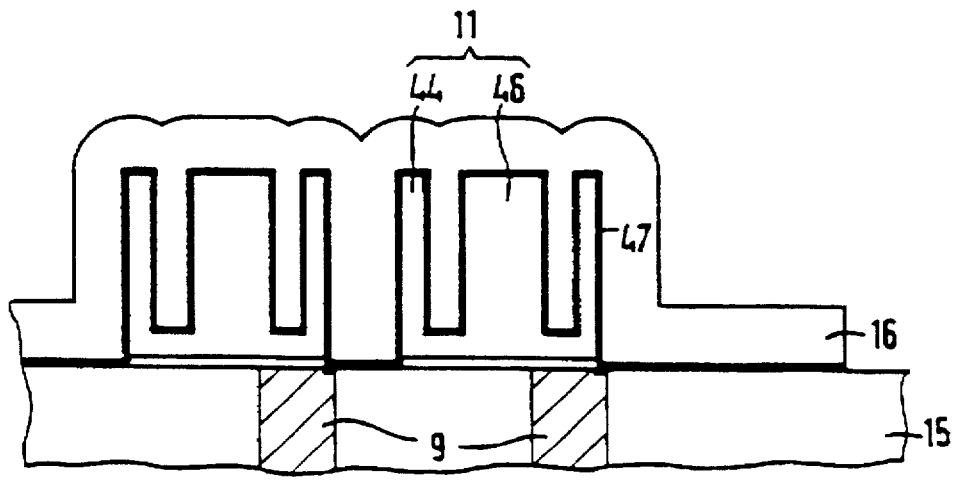

In the second embodiment of the process according to the invention, a CMP step is also used in the manufacture of the stacked capacitor on the completely planarized surface of the first insulating layer 15 or of the planarization layer 15c, since that planarized surface is then provided. A so-called "dish capacitor" is created which makes it possible to increase the capacitor area, and consequently the capacitance on a given base area. The general manufacture of such a dish capacitor is disclosed, for example, in an article by Toru Kaga et al., in IEEE Trans. on ED, Vol. 38, No. 2, Feb. 1991, page 255 and is therefore presented herein only in key points, supplemented by the steps according to the invention:

a) deposition of a thin doped polysilicon 40 which is provided as an etch stop and to form a defined base, b) deposition of a thick silicone oxide 41, c) anisotropic etching of holes 43 in the oxide 41 at points where a capacitor is to be produced later with the aid of a photolithographic procedure (resist mask 42), d) optionally, isotropic oxide etching to enlarge the hole 43 before removing the resist mask 42 (FIG. 26), e) deposition of a further doped polysilicon 44, f) manufacture of an oxide spacer 45, g) optionally, single or multiple repetition of the last two steps to create a "multiple dish", h) deposition of a doped silicon 46 to fill the remaining holes (FIG. 27), i) removal of the polysilicon 46, 44 on the planar wafer surface outside the hole 43 with the aid of a CMP step (FIG. 28), k) removal of the oxide 41 and of the oxide spacer 45, for example by means of a wet etching, selectively with respect to the polysilicon 44, 46, 40, l) preferably anisotropic etching of the first thin polysilicon layer 40, and m) deposition of a capacitor dielectric 47 (for example ONO), and deposition and patterning of the polysilicon counterplate 16 (FIG. 29).

The polysilicon 46, 44 on the planar surface is not removed by etching but rather by a CMP step (step i). The tops of the lower capacitor electrode 11 (i.e. the top of the "dish rim" formed from the polysilicon layer 44 and the tops of the "lamellae" formed from the polysilicon layer 46 in steps g) and h) and being situated in the dish) consequently have essentially the same height. The advantage is that the capacitors have a planar, upper covering surface which is well defined in height. Polysilicon can be polished with high selectivity with respect to oxide, so that it is possible to stop without difficulty at the oxide 41. Furthermore, it is advantageous if an isotropic oxide etching process is inserted to enlarge the holes (step d). This increases the capacitor size and consequently the memory capacitance, and in addition it becomes simpler to lay the capacitors over the TC pillars 9 in a fully overlapping manner. This is important if the TC pillars 9 are composed of a material on which no reliable capacitor dielectric 47 can be manufactured. It is then necessary to prevent the TC pillars 9 from being partially exposed alongside the lower capacitor electrode 11 (as is the case in FIG. 29). The counterplate 16 should preferably be deposited so thickly that all of the gaps between the polysilicon lamellae of a capacitor and between adjacent lower capacitor electrodes are filled. This is also simplified if the gap between the capacitors is made narrower by the isotropic oxide etching mentioned above. The thickness of the counterplate 16 can be reduced, which reduces the overall height of the capacitors and makes planarization easier.

The oxide layer 41 is clearly only an auxiliary layer which, like the oxide spacer 45, is later removed again. These two structures 41, 45 may therefore be formed of other materials which fulfill the conditions explained above. Preferably, they are formed of the same material so that they can be removed together in step k).

Further details are described in German Published, Non-Prosecuted Application DE 42 21 431 A1.

FIGS. 30–32, 3rd embodiment:

In a third embodiment, the manufacturing method envisages using a CMP step for the semiconductor memory configuration as well as for the purpose of completely planarizing the entire configuration, that is to say, in particular, the cell array and the periphery.

Figure 30:
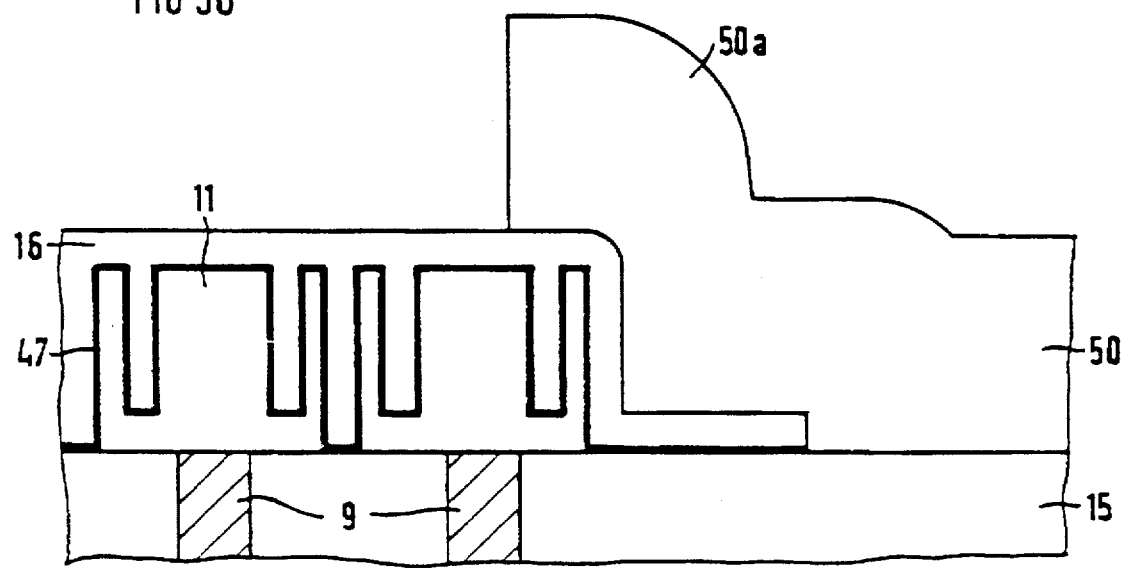
Figure 31:
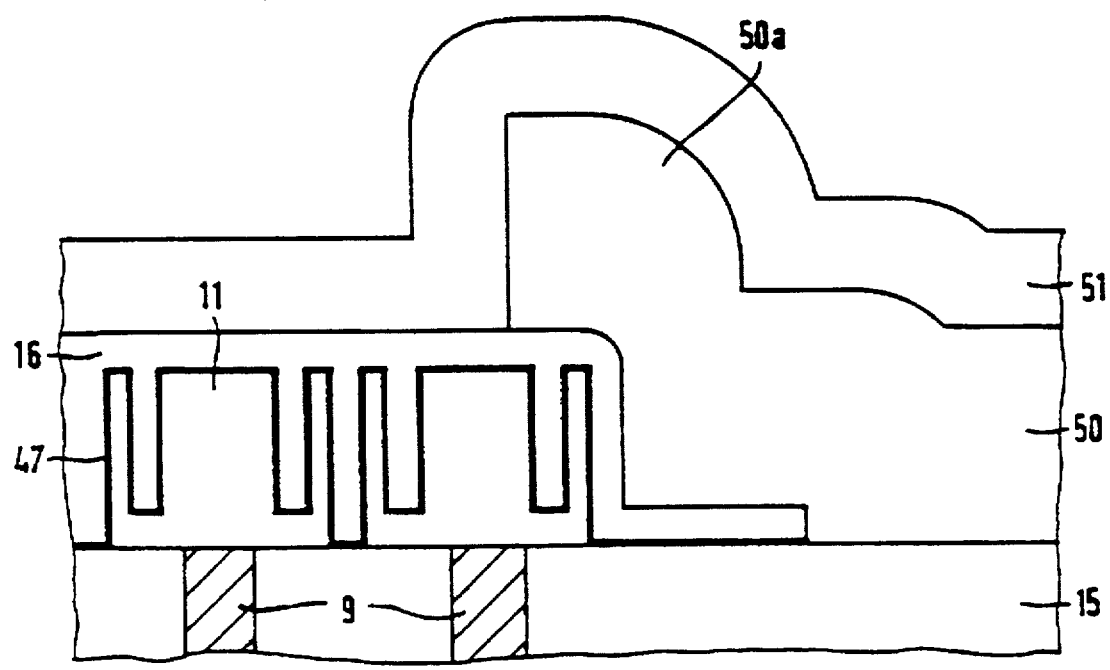
Figure 32:
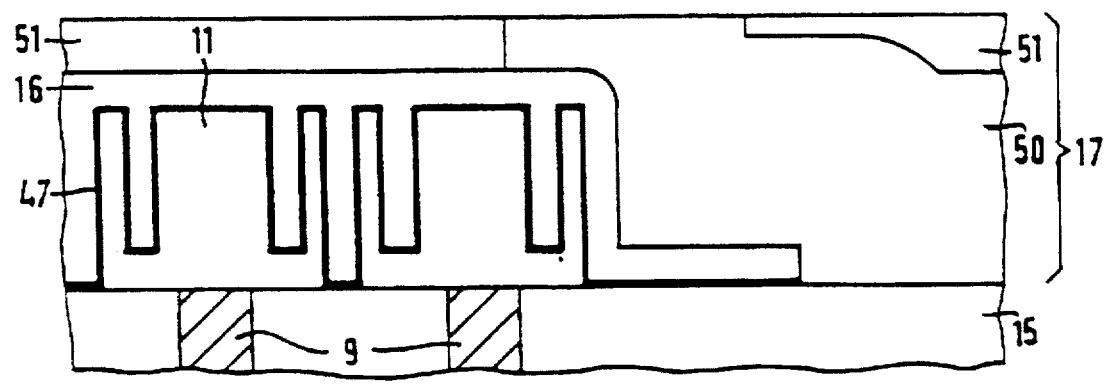

After the manufacture of the counterplate 16, a first dielectric 50 is deposited having a thickness which is exactly equal to the height of the capacitors 11, 47, 16 (including the counterplate). In practice, this can be achieved by measuring the height of the capacitors by means of profilometry and adjusting the layer thickness to this value. A first dielectric 50, for example silicon oxide which is 500 nm–1000 nm thick, in the cell array is then completely removed again by means of a photolithographic procedure in a suitable etching process, with a ridge 50a being left behind at the periphery of the cell array. Apart from the ridge 50a, the surface is then already completely planar (FIG. 30). The width of the ridge 50a depends essentially on the achievable alignment accuracy of the photolithographic procedure being used and is in the order of magnitude of 1 micrometer. Such narrow ridges, which also have a large mutual spacing of about 100 micrometers, can be readily planarized by the polishing process. According to the invention, for this purpose a second dielectric 51 which is about 500 nm thick and usually is also silicon oxide, is deposited (FIG. 31), and then some of the thickness of this second dielectric, for example 200 nm, is removed in a CMP step. Above the ridges 50a it is removed completely, and the ridge is also removed at the same time (FIG. 32). A completely planarized surface of the semiconductor memory configuration therefore then exists. The uniformity of the removal in the CMP step over an entire semiconductor wafer containing a plurality of memory configurations is usually not particularly good. The invention therefore provides a planarization process in which as little removal as possible is necessary in the CMP step. A particular advantage of the inventive process is that the uniformity in the etching of the first dielectric 50, which may also be poor, has no effect on the layer thicknesses present later since the etching is stopped at the counterplate 16. The layer thickness outside the cell array is therefore essentially determined by substantially precise, defined depositions. This is particularly advantageous since, in the periphery, so-called "non-nested" contact holes leading to the conductor tracks can consequently be manufactured in the bit-line level (see FIG. 1, contact hole 19), i.e. the contact holes 19 may extend beyond the edge of the conductor track 12, with the result that the area requirement of the circuit is considerably reduced. In the case of non-nested vias, the problem may occur of the contact-hole etching extending beyond the conductor track down to underlying conductor-track levels, and consequently short circuits may arise between the contact-hole filling and these lower conductor tracks. On one hand, the etching of the contact holes 19 must therefore be terminated early enough, before deeper conductor tracks are reached. On the other hand, each contact hole 19 must, of course, reach down to the conductor track 12. It is therefore necessary for the layer thickness of the entire dielectric above the conductor track 12 to be precisely known and to be sufficiently uniform over the semiconductor wafer. This is to a large extent guaranteed by the complete planarization according to the invention. The contact holes 18 for connecting the counterplate 16 are manufactured at the same time as the contact holes 19 leading to the bit-line level. As a result of the manufacturing process according to the invention, the counterplate 16 in a peripheral strip around the cell array is not much higher than the conductor tracks 12 in the bit-line level, with the result that the overetching on the counterplate during the etching of the contact hole 19 is small. This consequently prevents the counterplate from being etched through during the contact-hole etching.

Further details are described in German Published, Non-Prosecuted Application DE 42 21 432 A1.

We claim:

1. A semiconductor memory configuration, comprising single-transistor memory cells, each memory cell including:
   a semiconductor substrate;
   another layer disposed above said semiconductor substrate;
   a transistor being disposed in said semiconductor substrate and having first and second source/drain regions or S/D regions;
   a bit line disposed in a bit line level above said transistor and enclosing an angle with an active region of said transistor;
   an insulating cover being disposed on said bit line in said other layer and having an upper surface;
   a capacitor being disposed above said bit line and having a lower capacitor plate disposed on said other layer;
   a one-piece transistor/capacitor pillar or TC pillar electrically connecting said first S/D region to said lower capacitor plate and having an upper surface;
   a one-piece transistor bit-line pillar or TB pillar electrically connecting said second S/D region to said bit line;
   further conductor tracks in said bit-line level;
   a substrate pillar or SB pillar electrically connecting said further conductor tracks to said semiconductor substrate;
   said TB pillar and said SB pillar having upper surfaces being chemically-mechanically polished and disposed in one completely planarized surface; and
   said upper surface of said insulating cover and said upper surface of said TC pillar being disposed in another completely planarized surface.

2. The semiconductor memory configuration according to claim 1, wherein said other layer disposed above said semiconductor substrate is an insulating layer.

3. The semiconductor memory configuration according to claim 1, wherein said other layer disposed above said semiconductor substrate is a planarization layer.

4. A semiconductor memory configuration, comprising single-transistor memory cells, each memory cell including:
   a semiconductor substrate;
   another layer disposed above said semiconductor substrate;
   a transistor being disposed in said semiconductor substrate and having first and second source/drain regions or S/D regions;
   a bit line disposed in a bit line level above said transistor and enclosing an angle with an active region of said transistor;
   an insulating cover being disposed on said bit line in said other layer and having an upper surface;
   a capacitor being disposed above said bit line and having a lower capacitor plate disposed on said other layer;
   a transistor/capacitor pillar or TC pillar electrically connecting said first S/D region to said lower capacitor plate and having an upper surface;
   a transistor bit-line pillar or TB pillar electrically connecting said second S/D region to said bit line;
   further conductor tracks in said bit-line level;
   further underlying conductor tracks disposed in a word-line plane below said bit-line level;
   a word-line pillar or WB pillar electrically connecting said further conductor tracks to said further underlying conductor tracks, said WB pillar and said TB pillar having upper surfaces being chemically-mechanically polished and disposed in said one completely planarized surface; and said upper surface of said insulating cover and said upper surface of said TC pillar being disposed in another completely planarized surface.

5. A semiconductor memory configuration, comprising single-transistor memory cells, each memory cell including:
   a semiconductor substrate;
   another layer disposed above said semiconductor substrate;
   a transistor being disposed in said semiconductor substrate and having first and second source/drain regions or S/D regions;
   a bit line disposed in a bit line level above said transistor and enclosing an angle with an active region of said transistor;
   an insulating cover being disposed on said bit line in said other layer and having an upper surface;
   a capacitor being disposed above said bit line and having a lower capacitor plate disposed on said other layer;
   a transistor/capacitor pillar or TC pillar electrically connecting said first S/D region to said lower capacitor plate and having an upper surface;
   a transistor bit-line pillar or TB pillar electrically connecting said second S/D region to said bit line;
   further conductor tracks in said bit-line level;
   a substrate pillar or SB pillar electrically connecting said further conductor tracks to said semiconductor substrate;
   further underlying conductor tracks disposed in a word-line plane below said bit-line-level;
   a word-line pillar or WB pillar electrically connecting said further conductor tracks to said further underlying conductor tracks;
   said TB, SB and WB pillars having upper surfaces being chemically-mechanically polished and disposed in said one completely planarized surface; and
   said upper surface of said insulating cover and said upper surface of said TC pillar being disposed in another completely planarized surface.

6. The semiconductor memory configuration according to claim 1, including an edge insulation insulating said bit line from part of said TC pillar.

7. The semiconductor memory configuration according to claim 1, including a bit-line contact hole through which said bit line is connected to said TB pillar.

8. The semiconductor memory configuration according to claim 1, wherein said lower capacitor plate has upper surfaces being polished and disposed in a completely planarized surface.

9. The semiconductor memory configuration according to claim 1, including peripheral regions and cell arrays having upper surfaces being polished and disposed in a completely planarized surface.

10. The semiconductor memory configuration according to claim 4, wherein said other layer disposed above said semiconductor substrate is an insulating layer.

11. The semiconductor memory configuration according to claim 4, wherein said other layer disposed above said semiconductor substrate is a planarization layer.

12. The semiconductor memory configuration according to claim 4, including an edge insulation insulating said bit line from part of said TC pillar.

13. The semiconductor memory configuration according to claim 4, including a bit-line contact hole through which said bit line is connected to said TB pillar.

14. The semiconductor memory configuration according to claim 4, wherein said lower capacitor plate has upper surfaces being polished and disposed in a completely planarized surface.

15. The semiconductor memory configuration according to claim 4, including peripheral regions and cell arrays having upper surfaces being polished and disposed in a completely planarized surface.

* * * * *